(12) United States Patent
Goldblatt et al.

(10) Patent No.: US 8,948,716 B2
(45) Date of Patent: Feb. 3, 2015

(54) APPARATUSES AND METHODS FOR CONVERSION OF RADIO FREQUENCY (RF) SIGNALS TO INTERMEDIATE FREQUENCY (IF) SIGNALS

(75) Inventors: Jeremy Goldblatt, Encinitas, CA (US); Branislav Petrovic, La Jolla, CA (US); Martin Alderton, San Diego, CA (US); Wing Fat Lau, San Diego, CA (US)

(73) Assignee: Entropic Communications, Inc., San Diego, CA (US)

( * ) Notice: Subject to any disclaimer, the term of this patent is extended or adjusted under 35 U.S.C. 154(b) by 0 days.

(21) Appl. No.: 13/596,016

(22) Filed: Aug. 27, 2012

(65) Prior Publication Data

US 2013/0278304 A1    Oct. 24, 2013

Related U.S. Application Data

(60) Provisional application No. 61/637,119, filed on Apr. 23, 2012, provisional application No. 61/642,080, filed on May 3, 2012.

(51) Int. Cl.
*H04B 1/16* (2006.01)

(52) U.S. Cl.
USPC .......................................... 455/207; 455/313

(58) Field of Classification Search
USPC .......... 455/313–314, 318–319, 323, 207–209
See application file for complete search history.

(56) References Cited

U.S. PATENT DOCUMENTS

2006/0240793 A1* 10/2006 Andre et al. ................... 455/207

* cited by examiner

*Primary Examiner* — Christian Hannon
(74) *Attorney, Agent, or Firm* — Richard Bachand; Bruce Greenhaus; Sheppard Mullin Richter & Hampton LLP

(57) ABSTRACT

Various embodiments implement apparatuses and methods for conversion of radio frequency (RF) signals to intermediate frequency (IF) signals. More particularly, some embodiments are directed toward down conversion of RF signals to IF signals in a multi-band radio receiver, such as a satellite receiver, using a single oscillator for different frequency bands. For example, some of the apparatuses and methods presented are suitable for integration into monolithic RF integrated circuits in low-cost satellite receivers for home entertainment use.

8 Claims, 7 Drawing Sheets

FIG. 6A

Table 1

| Band | DRO | First LO | RF (min, center, max) | | | First IF (min, center, max) | | | div by | Second LO | Second IF (min, center, max) | | |
|---|---|---|---|---|---|---|---|---|---|---|---|---|---|
| | GHz | GHz | GHz | GHz | GHz | GHz | GHz | GHz | % | GHz | MHz | MHz | MHz |
| Ku | 17.30337 | 17.30337 | 12.2 | 12.45 | 12.7 | 5.10337 | 4.85337 | 4.60337 | 4 | 4.3258425 | 277.5275 | 577.5275 | 777.5275 |
| Ka Low | 17.30337 | 17.30337 | 18.3 | 18.55 | 18.8 | 0.99663 | 1.24663 | 1.49663 | 10 | 1.730337 | 233.707 | 483.707 | 733.707 |
| Ka High | 17.30337 | 17.30337 | 19.7 | 19.95 | 20.2 | 2.39663 | 2.64663 | 2.89663 | 8 | 2.1629213 | 233.7087 | 483.7087 | 733.7087 |

FIG. 6B

Table 2

| Band | DRO | First LO | RF (min, center, max) | | | First IF (min, center, max) | | | div by | Second LO | Second IF (min, center, max) | | |
|---|---|---|---|---|---|---|---|---|---|---|---|---|---|
| | GHz | GHz | GHz | GHz | GHz | GHz | GHz | GHz | % | GHz | MHz | MHz | MHz |
| Ku | 17.5 | 17.5 | 12.2 | 12.45 | 12.7 | 5.3 | 5.05 | 4.8 | 4 | 4.375 | 425 | 675 | 925 |
| Ka Low | 17.5 | 17.5 | 18.3 | 18.55 | 18.8 | 0.8 | 1.05 | 1.3 | 10 | 1.75 | 450 | 700 | 950 |
| Ka High | 17.5 | 17.5 | 19.7 | 19.95 | 20.2 | 2.2 | 2.45 | 2.7 | 10 | 1.75 | 450 | 700 | 950 |

APPARATUSES AND METHODS FOR CONVERSION OF RADIO FREQUENCY (RF) SIGNALS TO INTERMEDIATE FREQUENCY (IF) SIGNALS

CROSS-REFERENCE TO RELATED APPLICATIONS

This application claims the benefit of U.S. Provisional Application No. 61/637,119 filed Apr. 23, 2012, entitled "APPARATUS AND METHOD FOR CONVERSION OF RADIO FREQUENCY (RF) SIGNALS TO INTERMEDIATE FREQUENCY (IF) SIGNALS," and U.S. Provisional Application No. 61/642,080 filed May 3, 2012, entitled "APPARATUS AND METHOD FOR CONVERSION OF RADIO FREQUENCY (RF) SIGNALS TO INTERMEDIATE FREQUENCY (IF) SIGNALS," which are hereby incorporated herein by reference.

TECHNICAL FIELD

The present invention relates to conversion of radio frequency (RF) signals to intermediate frequency (IF) signals, and more particularly, to conversion of RF signals to IF signals in a multi-band receiver.

DESCRIPTION OF THE RELATED ART

In modern home entertainment systems, video, audio and multimedia contents are downloaded through wired and wireless communication links, for example, satellite communication links. Current providers of home entertainment service through satellite communication links include DIRECTV® and DISH®.

Satellite receivers in home entertainment systems are typically required to receive RF signals in various microwave frequency bands. For example, the frequency spectra of 12.2-12.7 GHz in the Ku band, 18.3-18.8 GHz in the lower Ka band ("Ka-Lo band"), and 19.7-20.2 GHz in the upper Ka band ("Ka-Hi band") have been used in satellite downlinks for home entertainment. In conventional satellite receivers, separate local oscillators are typically required to down convert RF signals in each frequency band to IF signals. For example, the Ku-band RF signals are typically dawn converted to IF signals in a frequency band of 250-750 MHz, while the Ka-Lo and Ka-Hi band RF signals are typically down converted to IF signals in a frequency band of 260-760 MHz.

A conventional satellite receiver may include a plurality of RF-to-IF down converters for a plurality of RF bands, respectively. FIG. 1 is a diagram illustrating an example of a conventional satellite receiver capable of receiving satellite downlink signals in the K-frequency band (also known as the "K band"). Exemplary frequency bands in the K band include Ku band, Ka-Lo band and Ka-Hi band. Referring to FIG. 1, the apparatus for converting RF signals to IF signals in the conventional satellite receiver receives RF signals from three separate antenna feeds, including an antenna feed 102 for the Ku band, a first antenna feed 104 for the Ka-Lo and Ka-Hi bands, and a second antenna feed 106 for the Ka-Lo and Ka-Hi bands. In a typical implementation, the antenna feeds 102, 104 and 106 are separated by predetermined angles for receiving separate satellite downlink signals. Moreover, each of the antenna feeds may receive RF signals occupying the same frequency band but separated by polarization. For example, the first Ka-Lo/Ka-Hi antenna feed 104 at 102.8° angle has two separate polarized channels—a left-hand circular polarized (LHCP) channel 108 and a right-hand circular polarized (RHCP) channel 110. Similarly, the second Ka-Lo/Ka-Hi antenna feed 106 at 99.2° angle has LHCP and RHCP channels 112 and 114, respectively, and the Ku-band antenna feed at 101° angle has LHCP and RHCP channels 116 and 118, respectively.

The RF signal in each of the polarization channels from each of the antenna feeds passes through a separate down converter chain that includes an oscillator, a mixer and one or more filters. For example, the down converter chain 120 for the RHCP channel from the 102.8° Ka-Lo/Ka-Hi feed 104 includes one or more RF amplifiers 122 and 124 and an RF filter 126. For the RHCP channel from the 102.8° Ka-Lo/Ka-Hi feed 104, the received RF signal passes through one or more filters. For example, as shown, the received RF signal passes through two parallel band pass filters 128 and 130 for Ka-Lo and Ka-Hi bands, respectively. The Ka-Lo RF signal is mixed with a local oscillator signal from an oscillator 132 by a mixer 134 to generate an IF signal (e.g., in a frequency range of 260-760 MHz), and an image of the IF signal. A band pass filter 136 filters out the image such that only the desired IF signal is provided at the IF output 138.

Similarly, the Ka-Hi RHCP RF signal from the 102.8° feed 104 that has passed through the band pass filter 130 is mixed with a local oscillator signal from a separate local oscillator 140 by a mixer 142 to generate an IF signal, also in the 260-760 MHz band, for example, and an image of that IF signal. A band pass filter 144 filters out the image such that only the desired IF signal is provided at the IF output 146.

The structure for each down converter chain for converting received RF signals from the 99.2° Ka-band feed 106 is identical to that of the 102.8° Ka-band feed 104. Again, the 99.2° Ka-band feed has two separate local oscillators 146 and 148 for Ka-Lo and Ka-Hi bands, respectively. The Ku-band down converter chain for the 101° Ku-band feed is also similar to the Ka-band down converter chains, except that the RHCP and LHCP channels are not further divided into high and low frequency sub-bands.

In satellite receivers, and more particularly, in satellite receiver chipsets, it is desirable to reduce the number of RF components to simplify the circuitry and to reduce the costs while maintaining the quality of output IF signals.

SUMMARY OF VARIOUS EMBODIMENTS

Apparatuses and methods for conversion of radio frequency (RF) signals to intermediate frequency (IF) signals are presented. More particularly, some implementations provide down conversion of RF signals to IF signals in a multi-band radio receiver, such as a satellite receiver, using a single oscillator for different frequency bands. Some of the apparatuses and methods presented are suitable for integration into monolithic RF integrated circuits in low-cost satellite receivers for home entertainment use.

In accordance with some embodiments, an apparatus for conversion of RF signals to IF signals may comprise: a single oscillator capable of generating an oscillator frequency; a first-stage mixer coupled to down convert received RF signals using the oscillator frequency to generate a first-stage IF signal; a first frequency divider coupled to the oscillator to generate a first divided oscillation frequency; a first second-stage mixer coupled to down convert the first-stage IF signal using the first divided oscillation frequency to generate a first second-stage IF signal; a second frequency divider coupled to the oscillator to generate a second divided oscillation frequency; a second second-stage mixer coupled to down convert the first-stage IF signal using the second divided oscillation frequency to generate a second second-stage IF signal.

A filter may be coupled to the output of each first-stage mixer to generate a filtered first-stage IF signal. In yet embodiment, a second filter is coupled to each second-stage mixer to generate a filtered second-stage IF signal. At least one amplifier may be coupled between each RF input and a respective first-stage mixer to amplify the received RF signal. Additionally, an RF filter may be coupled between each RF input and a respective first-stage mixer to filter the received RF signal.

For example, an apparatus for conversion of radio frequency (RF) signals in a plurality of frequency bands to intermediate frequency (IF) signals may comprise: an oscillator capable of generating an oscillator frequency LO; and a down conversion chain. The down conversion may comprise: a first-stage mixer coupled to the oscillator and configured to down convert a received RF signal $RF_1$, using the oscillator frequency LO to generate a first-stage IF signal $IF_a$; a first frequency divider coupled to the oscillator and configured to generate a first divided oscillation frequency by dividing the oscillator frequency LO; a first second-stage mixer coupled to the first frequency divider and the first-stage mixer and configured to down convert the first-stage IF signal $IF_a$ using the first divided oscillation frequency to generate a first second-stage IF signal $IF_1$; a second frequency divider coupled to the oscillator and configured to generate a second divided oscillation frequency by dividing the oscillator frequency LO; and a second second-stage mixer coupled to the second frequency divider and the first-stage mixer and configured to down convert the first-stage IF signal $IF_a$ using the second divided oscillation frequency to generate a second second-stage IF signal $IF_2$. Generally, the first second-stage IF signal $IF_1$ and the second second-stage IF signal $IF_2$ are within substantially the same frequency band ($IF_1 \cong IF_2$).

For the foregoing embodiments, the received RF signal $RF_1$ may be from a first frequency band and the received RF signal $RF_2$ is from a second frequency band. The apparatus may further comprise a first-stage filter coupled between the first-stage mixer and the first second-stage mixer and configured to filter the first-stage IF signal $IF_a$ received by the first second-stage mixer. Additionally, the apparatus may further comprise a first-stage filter coupled between the first-stage mixer and the second second-stage mixer and configured to filter the first-stage IF signal $IF_a$ received by the first second-stage mixer.

In some embodiments, the first frequency divider may be configured to generate the first divided oscillation frequency by dividing the oscillator frequency LO by a fraction P, and the second frequency divider is configured to generate a second divided oscillation frequency by dividing the oscillator frequency LO by a fraction Q, and P, Q, and LO are selected such that $|LO/P-LO-RF1| \cong |LO/Q-LO-RF2| \cong IF1 \cong IF2$, (where |x| represents the absolute value of variable x).

In another example, an apparatus for conversion of radio frequency (RF) signals in a plurality of frequency bands to intermediate frequency (IF) signals may comprise: an oscillator capable of generating an oscillator frequency LO; a first down conversion chain; and a second down conversion chain. The first down conversion chain may comprise: a first first-stage mixer coupled to the oscillator and configured to down convert a received RF signal $RF_1$ using the oscillator frequency LO to generate a first first-stage IF signal $IF_a$; a first frequency divider coupled to the oscillator and configured to generate a first divided oscillation frequency by dividing the oscillator frequency LO; and a first second-stage mixer coupled to the first frequency divider and configured to down convert the first first-stage IF signal $IF_a$ using the second divided oscillation frequency to generate a first second-stage IF signal $IF_1$ using the first divided oscillation frequency. Likewise, the second down conversion chain may comprise: a second first-stage mixer coupled to the oscillator and configured to down convert a received RF signal $RF_2$ using the oscillator frequency LO, to generate a second first-stage IF signal $IF_b$; a second frequency divider coupled to the oscillator and configured to generate a second divided oscillation frequency by dividing the oscillator frequency LO; and a second second-stage mixer coupled to the second frequency divider and configured to down convert the second first-stage IF signal $IF_b$ using the second divided oscillation frequency to generate a second second-stage IF signal $IF_2$. Generally, the first second-stage IF signal $IF_1$ and the second second-stage IF signal $IF_2$ are within substantially the same frequency band ($IF_1 \cong IF_2$).

For the embodiments above, the received RF signal $RF_1$ may be from a first frequency band and the received RF signal $RF_2$ is from a second frequency band. The apparatus may further comprise: a first first-stage filter coupled between the first first-stage mixer and the first second-stage mixer and configured to filter the first first-stage IF signal $IF_a$ received by the first second-stage mixer; or a second first-stage filter coupled between the second first-stage mixer and the second second-stage mixer and configured to filter the second first-stage IF signal $IF_b$ received by the second second-stage mixer. In addition, the first frequency divider may be configured to generate the first divided oscillation frequency by dividing the oscillator frequency LO by a fraction P, and the second frequency divider may be configured to generate a second divided oscillation frequency by dividing the oscillator frequency LO by a fraction Q, and P, Q, and LO are selected such that $|LO/P-LO-RF1| \cong |LO/Q-LO-RF2| \cong IF1 \cong IF2$.

In an embodiment, the apparatus for converting RF signals to IF signals is implemented in a multi-band receiver, such as a satellite receiver. An example of a satellite receiver may be capable of receiving satellite downlink signals in the Ka-Lo, Ka-Hi and Ku frequency bands. In an embodiment, the single oscillator for down converting RF signals in all of the frequency bands may comprise a dielectric resonant oscillator (DRO).

According to some embodiments, a method of converting radio frequency (RF) signals to intermediate frequency (IF) signals in a multi-band receiver may be provided, which comprises: providing an oscillator frequency by a single oscillator; down converting received RF signals in a plurality of frequency bands using the oscillator frequency to generate a plurality of first-stage IF signals; dividing the oscillator frequency by a plurality of predetermined numbers to generate a plurality of divided oscillation frequencies; and down converting the first-stage IF signals using the divided oscillation frequencies to generate a plurality of second-stage IF signals, respectively.

For example, a method of converting radio frequency (RF) signals in a plurality of frequency bands to intermediate frequency (IF) signals in a multi-band receiver may comprise: providing an oscillator frequency LO using an oscillator; down converting a received RF signal RF using the oscillator frequency LO to generate a set of first-stage IF signals $IF_{1P}$; dividing the oscillator frequency by a plurality of predetermined numbers to generate a plurality of divided oscillation frequencies; and down converting the plurality of first-stage IF signals $IF_{1P}$ using the plurality of divided oscillation frequencies to generate a plurality of second-stage IF signals $IF_{2P}$, respectively.

Some embodiments may provide a method of designing an apparatus for converting radio frequency (RF) signals in a plurality of frequency bands to intermediate frequency (IF)

signals, comprising: receiving a frequency value RFreq corresponding to an input RF signal RF for the apparatus; receiving a set of frequencies values IFreq={IFreq$_1$, IFreq$_2$, ... IFreq$_i$}, wherein the frequency value IFreq$_i$ respectively corresponds to an output IF signal IF$_1$ in the set of output IF signals IF={IF$_1$, IF$_2$, ... IF$_i$} for the apparatus, and the frequency values in the set of frequency values IFreq are within substantially the same frequency band; and determining an oscillator frequency LO and a set of fractions D={D$_1$, D$_2$, D$_3$, ... D$_i$}, such that |LO/D1−|LO−RF||≅|LO/D2−|LO−RF||≅|LO/Di−|LO−RF||≅IFreq1≅IFreq2≅IFreqi, wherein the fraction value D$_i$ respectively corresponds to a frequency divider in a set of frequency dividers Div={Div$_1$, Div$_2$, ... Div$_i$} included in the apparatus. The apparatus designed may comprise: an oscillator that generates the oscillator frequency LO, a first-stage mixer configured to down convert the input RF signal RF using the oscillator frequency LO to generate a first-stage IF signal IF$_a$; the set of frequency dividers Div, wherein the frequency divider Div$_i$ is configured to generate a divided oscillation frequency DLO$_i$ in a set of divided oscillation frequencies DLO={DLO$_1$, DLO$_2$, DLO$_3$, ... DLO$_i$} by dividing the oscillator frequency LO by the fraction D$_i$; and a set of second-stage mixer Mix={Mix$_1$, Mix$_2$, ... Mix$_i$}, wherein the second-stage mixer Mix$_i$ is configured to down convert the first-stage IF signal IF$_a$ using the divided oscillation frequency DLO$_i$ in the set of divided oscillation frequencies DLO to generate the output IF signal IF$_i$.

This summary does not limit the scope of the invention(s), which is defined solely by the claims and the equivalents thereof. Other features and aspects will become apparent from the following detailed description, taken in conjunction with the accompanying drawings.

BRIEF DESCRIPTION OF THE DRAWINGS

Various embodiments of the invention(s) are described in detail with reference to the following figures. The drawings are provided for purposes of illustration only and merely depict typical or example embodiments. These drawings are provided to facilitate the reader's understanding and shall not be considered limiting of the breadth, scope, or applicability of the invention(s).

FIGS. 6A and 6B are tables providing examples of exemplary system parameters.

The figures are not intended to be exhaustive or to limit the invention(s) to the precise form disclosed. It should be understood that the invention(s) described herein can be practiced with modification and alteration, and that the invention(s) be limited only by the claims and the equivalents thereof.

DETAILED DESCRIPTION OF THE EMBODIMENTS OF THE INVENTION(S)

The present application relates to conversion of radio frequency (RF) signals to intermediate frequency (IF) signals, More particularly, implementations are directed toward down conversion of RF signals to IF signals in a multi-band radio receiver using a single oscillator for different frequency bands. For example, some embodiments are used for converting satellite RF signals to IF signals in a satellite receiver for a home entertainment system.

Figure 1:
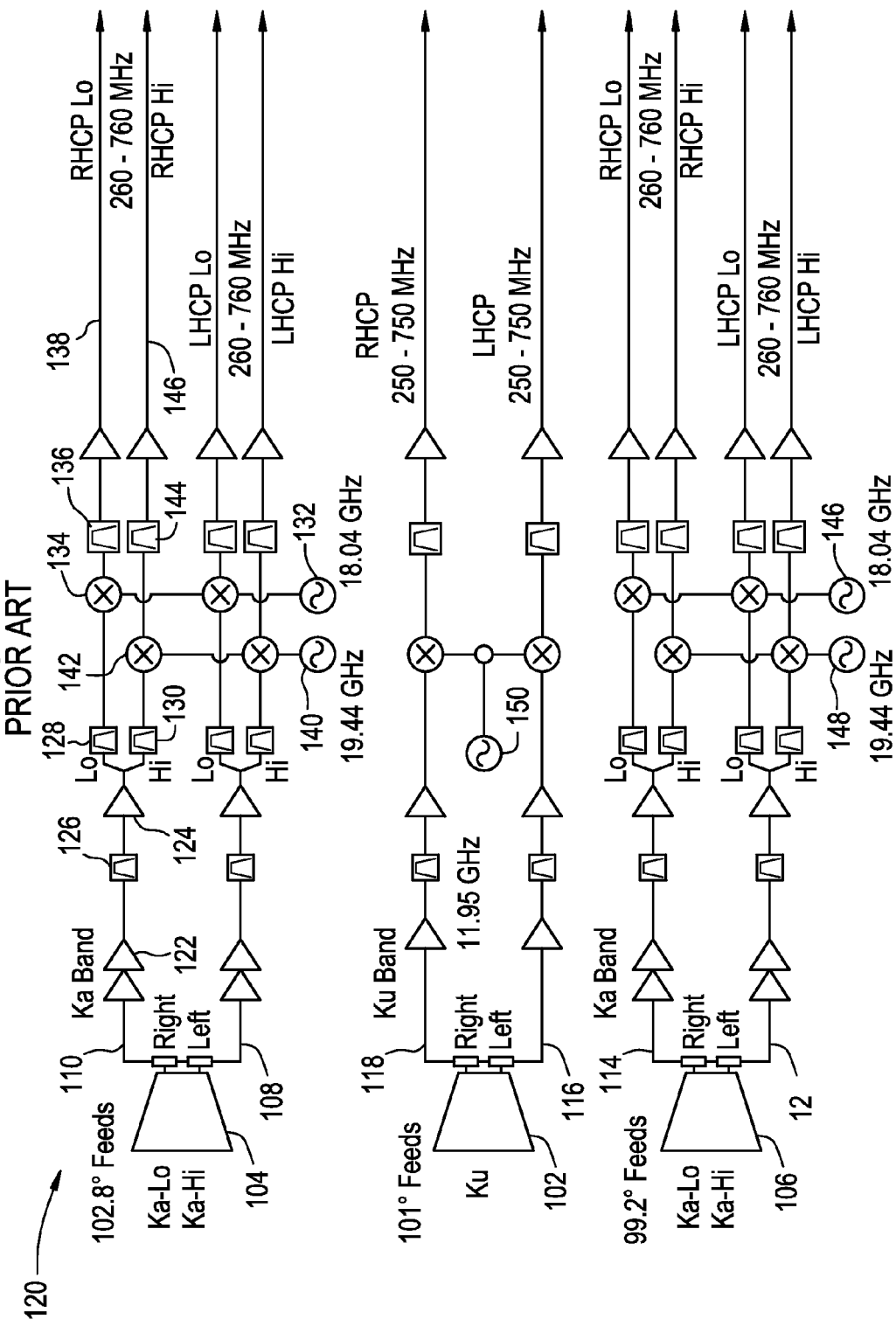
FIG. 1 is a diagram illustrating an example of a conventional satellite receiver having a plurality of down converter chains.
Figure 2:
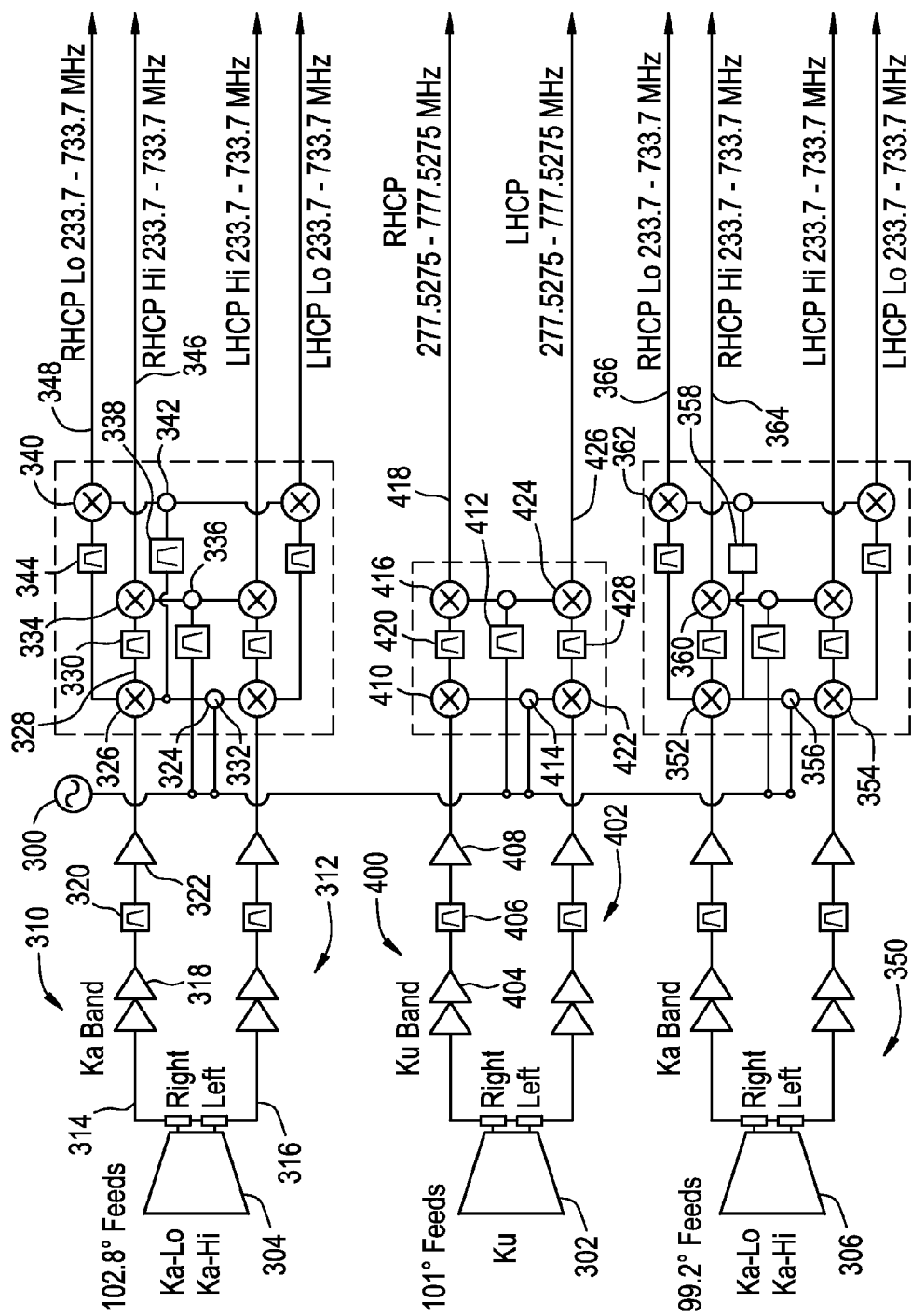
FIG. 2 is a diagram illustrating an example of a satellite receiver having a plurality of down converter chains using a single oscillator.

FIG. 2 is a diagram illustrating an example of an apparatus for down conversion of RF signals to IF signals. In this example, a single oscillator 300 is used for the down conversion of RF signals in the K band (e.g., Ka-Hi, Ka-Lo and Ku bands). In some embodiments, the oscillator 300 is a dielectric resonant oscillator (DRO) or other oscillator capable of generating a clean, stable frequency tone. For example, the oscillator 300 may be a DRO configured to generate a stable frequency tone at 17.30337 GHz for the down conversion of K band (e.g., Ka-Hi, Ka-Lo and Ku band) RF signals.

The illustrated apparatus includes a Ku-band antenna feed 302 and two Ka-Lo/Ka-Hi antenna feeds 304 and 306 for receiving downlink RF signals from satellites. A left-hand circular polarization (LHCP) signal and a right-hand circular polarization (RHCP) signal are provided on each frequency band received by the antenna feeds 302, 304, and 306, thereby providing two separate channels on each frequency band. In some embodiments, vertical and horizontal or other orthogonal polarizations may be used for providing separate channels on each frequency band.

In the embodiment of FIG. 2, RF signals received by the 102.8° Ka-Lo/Ka-Hi feed are separated into RHCP and LHCP channels 314 and 316, respectively, at the receiver front end 308. Separate down converter chains 310 and 312 are provided for the RHCP and LHCP channels 314 and 316, respectively. Each of the RHCP and LHCP channels may carry radio signals in the Ka-Lo and Ka-Hi bands. The down converter chains 310 and 312 for respective RHCP and LHCP channels may have an identical RF-to-IF down converter structure, and the detailed description provided below with respect to the RHCP channel applies equally to the LHCP channel from the 102.8° Ka-Lo/Ka-Hi feed.

The received RF signal in the RHCP channel 314 may pass through one or more preamplifiers 318 and an RF filter 320. The preamplified and filtered RF signal may pass through another RF amplifier 322 before being down converted to IF. The single DRO 300 may provide a clean, stable tone at an oscillation frequency f$_0$ for down converting both Ka-Hi and Ka-Lo RF signals. In some embodiments, a splitter 324 may be implemented to provide the same oscillation frequency f$_0$ for down converting signals in both RHCP 310 and LHCP 312 channels. A first-stage mixer 326 may be coupled to mix the filtered and amplified input RF signal from the RHCP channel 314 in the Ka-Hi band with the tone generated by the DRO 300 at oscillation frequency f$_0$ to generate a first-stage IF signal at its output 328. In turn, the first IF signal at the output 328 may be filtered by an image-rejection filter 330 configured to reject the image of the first-stage IF signal.

In some embodiments, the oscillation frequency f$_0$ may be divided in a frequency divider 332 by a predetermined number (e.g., 8), which generates a first divided oscillation frequency (e.g., f$_0$/8). The first divided oscillation frequency may be received by a second-stage mixer 334, via a splitter 336, to further down convert the first-stage IF signal to generate a second-stage IF signal. As shown in the embodiment of FIG. 2, the second-stage IF signal may, for example, be within a frequency range of 233.7-733.7 MHz for the RHCP Ka-Hi channel.

For the RHCP Ka-Lo channel, another frequency divider 338 may be utilized to divide the oscillation frequency by another predetermined number (e.g., 10) to generate a second divided oscillation frequency (e.g., $f_0/10$). The resulting divided oscillation frequency may be received by another second-stage mixer 340, via another splitter 342, to generate a second-stage IF signal for the RHCP Ka-Lo channel. Like the down converter chain for the RHCP Ka-Hi channel, an image-rejection filter 344 may be utilized to reject the image of the first-stage IF signal. As shown in the embodiment of FIG. 2, the output IF signals for both the RHCP Ka-Hi channel and the RHCP-Lo channel may, for example, be within a frequency range of 233.7-733.7 MHz.

In FIG. 2, the received RF signals in both Ka-Hi and Ka-Lo bands may initially be down converted by the first-stage mixer 326 for the RHCP channel to generate first-stage IF signals. The down converted first-stage IF signals may then be further down converted by two separate second-stage mixers 334 and 340, by mixing the first-stage LF signal with a first divided oscillation frequency (e.g., $f_0/8$) and a second divided oscillation frequency (e.g., $f_0/10$) to generate output IF signals for the RHCP Ka-Hi and RHCP Ka-Lo channels, respectively. Some embodiments may utilize two frequency dividers 332 and 338 having different divisors to separate the Ka-Hi and Ka-Lo signals into two separate IF outputs 346 and 348, respectively. Although the divisors of the frequency dividers 332 and 338 are shown as integers, fractional divisors or real number divisors may also be employed.

In the embodiment of FIG. 2, the RF-to-IF down converter structure 350 for the 99.2° Ka-Lo/Ka-Hi band feed 306 may be identical to that of the 102.8° Ka-Lo/Ka-Hi band feed 304. The single DRO 300 may provide the same oscillation frequency $f_0$ to first-stage mixers 352 and 354 for the RHCP and LHCP channels, respectively. Likewise, a first frequency divider 356 may be coupled to the DRO 300 to generate a first divided oscillation frequency (e.g., $f_0/8$) while a second frequency divider 358 may be coupled to the DRO 300 to generate a second divided oscillation frequency (e.g., $f_0/10$). The divided oscillation frequencies (e.g., $f_0/8$ and $f_0/10$) may be received by second-stage mixers 360 and 362, respectively, to further down convert the Ka-Hi and Ka-Lo signals to respective IF outputs 364 and 366 in the RHCP channels. The same two-stage mixer structure may be used to down convert the Ka-Hi and Ka-Lo signals in the LHCP channels for the 99.2° Ka-band feed 306.

The RF-to-IF down converter structure for the Ku-band feed 302 may be similar to those for the Ka-band feeds 304 and 306, except in that the RF signals received in the Ku-band are not further divided, into Ku-Hi and Ku-Lo sub-bands. RHCP and LHCP may be separate polarization channels in which received RF signals in the Ku-band are down converted through separate down converter chains 400 and 402. In some embodiments, the received RF signal in the RHCP channel may pass through one or more preamplifiers 404, an RF filter 406 and another RF amplifier 408. The amplified and filtered RF signal in the RHCP channel may then mixed with the frequency tone generated by the DRO 300 at oscillation frequency $f_0$ by a first-stage mixer 410, thereby generating a first-stage IF signal. For some embodiments, a frequency divider 412 may be coupled to the DRO 300 through a splitter 414 to generate a divided oscillation frequency. As shown in FIG. 2, the frequency divider 412 may divide the oscillation frequency by 4 to generate a divided oscillation frequency $f_0/4$ for Ku-band signals.

Embodiments may include a second-stage mixer 416 to mix the first-stage IF signal with a tone at a divided oscillation frequency (e.g., $f_0/4$), produced by the frequency divider 412, to generate an IF signal at output 418 for the RHCP Ku-band channel 400. According to some embodiments, an image-rejection filter 420 may be utilized between the first-stage mixer 410 and the second-stage mixer 416 for rejecting the IF image. Likewise, for the LHCP Ku-band channel 402, some embodiments may include a first-stage mixer 422 to down convert the RF signal in the LHCP channel using the tone generated by the DRO 300 at a oscillation frequency $f_0$, and a second-stage mixer 424 to further down convert the signal using the tone at a divided oscillation frequency (e.g., $f_0/4$), produced by the frequency divider 412, to generate an IF signal at output 426 for the LHCP channel. For some embodiments, an image-rejection filter 428 may be utilized between the first-stage mixer 422 and the second-stage mixer 424 for rejecting the IF image.

Figure 3:
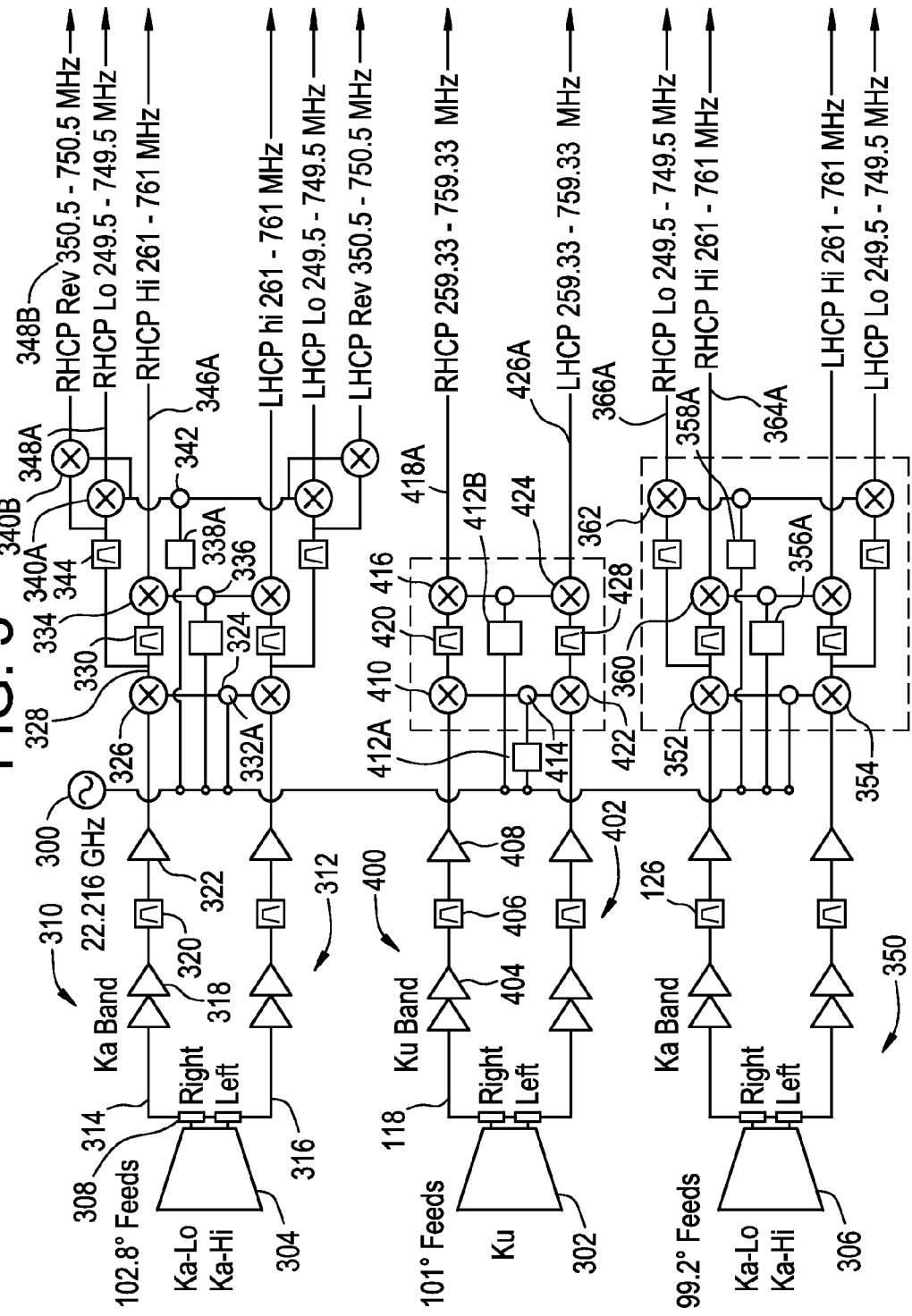
FIG. 3 is a diagram illustrating an example of a satellite receiver having a plurality of down converter chains using a single oscillator.

FIG. 3 is a diagram illustrating an example of a satellite receiver, having a plurality of down converter chains using a single oscillator, for receiving satellite downlink signals in the K band in accordance with some embodiments. The embodiment illustrated in FIG. 3 may be implemented in a receiver front-end (e.g., the low-noise block converter LNB) of a Ku+Ka+Ka reverse band down conversion to an Ultra-High Frequency (UHF) band. For example, the illustrated embodiment may allow a single dielectric resonator oscillator (DRO) to provide down conversion of Ku bands comprising 12.2-12.7 GHz, Ka-Low bands 18.3-18.8 GHz, Ka-High bands 19.7-202 GHz, and Ka-reverse bands 17.3-17.7 GHz, to the 250-750 MHz UHF frequency range.

As in FIG. 2, in FIG. 3 a single oscillator 300 may be capable of generating a clean, stable frequency tone, such as a dielectric resonant oscillator (DRO). As described herein, the oscillator 300 may be a DRO configured to generate a stable frequency tone at 17.30337 GHz for the clown conversion of K band RF signals.

The apparatus of FIG. 3 includes a Ku-band antenna feed 302 and two Ka-Lo/Ka-Hi antenna feeds 304 and 306 for receiving downlink RF signals from satellites. In FIG. 3, a left-hand circular polarization (LHCP) signal and a right-hand circular polarization (RHCP) signal may be provided on each frequency band received by the antenna feeds 302, 304, and 306, thereby providing two separate channels on each frequency band.

In FIG. 3, RF signals received by the 102.8° Ka-Lo/Ka-Hi feed may be separated into RHCP and LHCP channels 314 and 316, respectively, at the receiver front end 308. Separate down converter chains 310 and 312 may be provided for the RHCP and LHCP channels 314 and 316, respectively. Each of the RHCP and LHCP channels may carry radio signals in the Ka-Lo and Ka-Hi bands. The down converter chains 310 and 312 for respective RHCP and LHCP channels may have an identical RF-to-IF down converter structure, and the detailed description provided below with respect to the RHCP channel may apply equally to the LHCP channel from the 102.8° Ka-Lo/Ka-Hi feed.

In FIG. 3 the received RF signal in the RHCP channel 314 may pass through one or more preamplifiers 318 and an RF filter 320. The preamplified and filtered RF signal may pass through another RF amplifier 322 before being down converted to IF. The single DRO 300 may provide a clean, stable tone at an oscillation frequency $f_0$ for down converting both Ka-Hi and Ka-Lo RF signals. In some embodiments, a splitter 324 may be implemented to provide the same oscillation frequency $f_0$ for down converting signals in both RHCP and LHCP channels. A first-stage mixer 326 may be coupled to mix the filtered and amplified input RF signal from the RHCP channel 314 in the Ka-Hi band with the tone generated by the DRO 300 at oscillation frequency $f_0$ to generate a first-stage IF signal at its output 328. In turn, the first IF signal at the output 328 may be filtered by an image-rejection filter 330 configured to reject the image of the first-stage IF signal.

In some embodiments, the oscillation frequency $f_0$ may be divided in a frequency divider 332A by the predetermined number of 8, which generates a first divided oscillation frequency $f_0/8$. The first divided oscillation frequency may be received by a second-stage mixer 334, via a splitter 336, to further down convert the first-stage IF signal to generate a second-stage IF signal. As shown in the embodiment of FIG. 3, the second-stage IF signal may, for example, be within a frequency range of 261-761 MHz for the RHCP Ka-Hi channel.

For the RHCP Ka-Lo channel and RHCP Ka-Rev channel, another frequency divider 338A may be utilized to divide the oscillation frequency to generate a second divided oscillation frequency of $(3/16)f_0$. The resulting divided oscillation frequency may be received by a first second-stage mixer 340A and a second second-stage mixer 340B, via another splitter 342, to generate a second-stage IF signal for the RHCP Ka-Lo channel and the RHCP Ka-Rev channel. Like the down converter chain for the RHCP Ka-Hi channel, an image-rejection filter 344 may be utilized to reject the image of the first-stage IF signal. As shown in the embodiment of FIG. 3, the output IF signals for the RHCP-Lo channel may, for example, be within a frequency range of 249.5-749.5 MHz, while the RHCP-Rev channel may, for example, be in a frequency range of 350.5-750.5 MHz.

For FIG. 3, the received RF signals in both Ka-Hi and Ka-Lo bands may initially be down converted by the first-stage mixer 326 for the RHCP channel to generate first-stage IF signals. The down converted first-stage IF signals may then be further down converted by separate second-stage mixers 334, 340A. and 340B, by mixing the first-stage IF signal with a first divided oscillation frequency $f_0/8$ and a second divided oscillation frequency $f_0$ (3/16) to generate output IF signals for the RHCP Ka-Hi, RHCP Ka-Lo, and RHCP Ka-Rev channels, respectively. Some embodiments may utilize the frequency divider 332A to separate the Ka-Hi and Ka-Lo signals into IF output 346A, and the frequency divider 338A to separate the Ka-Hi and Ka-La signals into separate IF outputs 348A and 348B. As described herein, although the divisors for the frequency dividers 332A and 338A as shown in FIG. 3 are integers, various embodiments are not limited to just integer divisors.

In the embodiment of FIG. 3, the RF-to-IF down converter structure 350 for the 99.2° Ka-Lo/Ka-Hi band feed 306 may be similar to that of the 102.8° Ka-Lo/Ka-Hi band feed 304. The single DRO 300 may provide the same oscillation frequency $f_0$ to first-stage mixers 352 and 354 for the RHCP and LHCP channels, respectively. Likewise, a first frequency divider 356A may be coupled to the DRO 300 to generate a first divided oscillation frequency $f_0/8$, while a second frequency divider 358A may be coupled to the DRO 300 to generate a second divided oscillation frequency $f_0$ (3/16). The divided oscillation frequencies (e.g., $f_0/8$ and $f_0$ (3/16)) may be received by second-stage mixers 360 and 362, respectively, to further down convert the Ka-Hi and Ka-Lo signals to respective IF outputs 364A and 366A in the RHCP channels. The same two-stage mixer structure may be used to down convert the Ka-Hi and Ka-Lo signals in the LHCP channels for the 99.2° Ka-band feed 306.

As shown in the embodiment of FIG. 3, the RF-to-IF down converter structure for the Ku-band feed 302 may be similar to those for the Ka-band feeds 304 and 306, except in that the RF signals received in the Ku-band are not further divided into Ku-Hi and Ku-Lo sub-bands. RHCP and LHCP may be separate polarization channels in which received RF signals in the Ku-band are down converted through separate down converter chains 400 and 402. In some embodiments, the received RF signal in the RHCP channel may pass through one or more preamplifiers 404, an RF filter 406 and another RF amplifier 408. The amplified and filtered RF signal in the RHCP channel may then mixed with the frequency tone generated by the DRO 300 at oscillation frequency $f_0$ by a first-stage mixer 410, thereby generating a first-stage IF signal. For some embodiments, a frequency divider 412A may be coupled to the DRO 300 and a frequency divider 412B may be coupled to the frequency divider 412A through a splitter 414 to generate a divided oscillation frequency. As illustrated in FIG. 3, the frequency divider 412A may divide the oscillation frequency by 2 to generate a divided oscillation frequency $f_0/2$, and the frequency divider 412B may further divide the oscillation frequency produced through the frequency divider 412A by 6 to generate a resulting, divided oscillation frequency $f_0/12$.

For the RHCP Ku-band channel, some embodiments may include a first-stage mixer 410 to down convert the RF signal in the RHCP channel using the tone at a divided oscillation frequency $f_0/2$, produced by the frequency divider 412A, and a second-stage mixer 416 to further down convert the signal using the tone at a divided oscillation frequency $f_0/12$, produced by the frequency divider 412B, to generate an IF signal at output 418A for the RHCP channel. According to some embodiments, an image-rejection filter 420 may be utilized between the first-stage mixer 410 and the second-stage mixer 416 for rejecting the IF image. Likewise, for the LHCP Ku-band channel, some embodiments may include a first-stage mixer 422 to down convert the RF signal in the LHCP channel using the tone at a divided oscillation frequency $f_0/2$, produced by the frequency divider 412A, and a second-stage mixer 424 to further down convert the signal using the tone at a divided oscillation frequency $f_0/12$, produced by the frequency divider 412B, to generate an IF signal at output 426 for the LHCP channel. For some embodiments, an image-rejection filter 428 may be utilized between the first-stage mixer 422 and the second-stage mixer 424 for rejecting the IF image.

Figure 4:
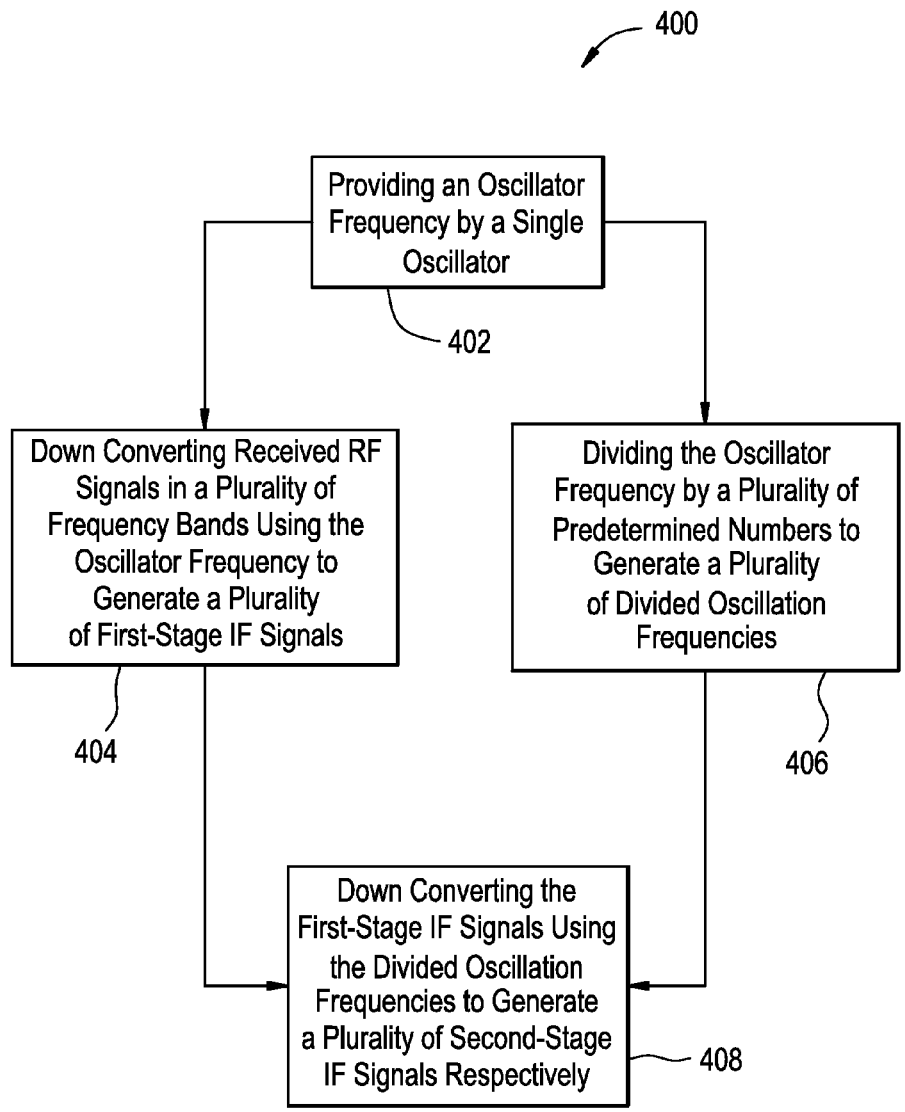
FIG. 4 is a flowchart illustrating an example of a method for down converting radio frequency (RF) signals to intermediate frequency (IF) signals.

FIG. 4 is a flowchart 400 illustrating an example of a method for down converting radio frequency (RF) signals to intermediate frequency (IF) signals in accordance with some embodiments. In accordance with some embodiments, the method may be utilized in a multi-band receiver using a single oscillator. The method, as shown in FIG. 4, may include an operation 402 of providing an oscillator frequency (e.g., $f_0$) from a single oscillator; an operation 504 of down converting received RF signals, in a plurality of frequency bands, to a plurality of first-stage IF signals using the oscillator frequency $f_0$; an operation 506 of dividing the oscillator frequency (e.g., $f_0$) by a plurality of predetermined numbers to generate a plurality of divided oscillation frequencies; and an operation 508 of down converting the first-stage IF signals using the divided oscillation frequencies (e.g., $f_0/d_1$, $f_0/d_2$, $f_0/d_3$, ... $f_0/d_n$, where each of $d_1$, $d_2$, $d_3$, ... $d_n$ represents one of the plurality of predetermined numbers to generate a plurality of second-stage IF signals, respectively.

It should be understood that the method operations described herein may not be performed according to the sequence described above but, rather may be performed in an order that varies between embodiments. For instance, the operation 506 of dividing the oscillator frequency to generate a plurality of divided oscillation frequencies may be performed before, after, or concurrently with the operation 504 of down converting received RF signals to a plurality of first-stage IF signals.

As discussed herein, embodiments of the invention may utilize shared local oscillators between different down conversion chains for different frequency bands. For example, some embodiments may utilize a single oscillator, such as a single DRO, capable of providing a clean and stable (e.g., low jitter) single-frequency tone for the purpose of down converting of RF signals, which may be in widely separated frequency bands (e.g., the Ku and Ka bands, with a band separation of as much as 6-8 GHz). In some embodiment, the local oscillator shared by the down conversion chains may be the same local oscillator used as a digital clock in digital signal processing elsewhere in a system. As also described herein, RF-to-IF conversion in the different frequency bands may be achieved by using a plurality of frequency dividers to produce the IF outputs for the respective channels.

Figure 5:
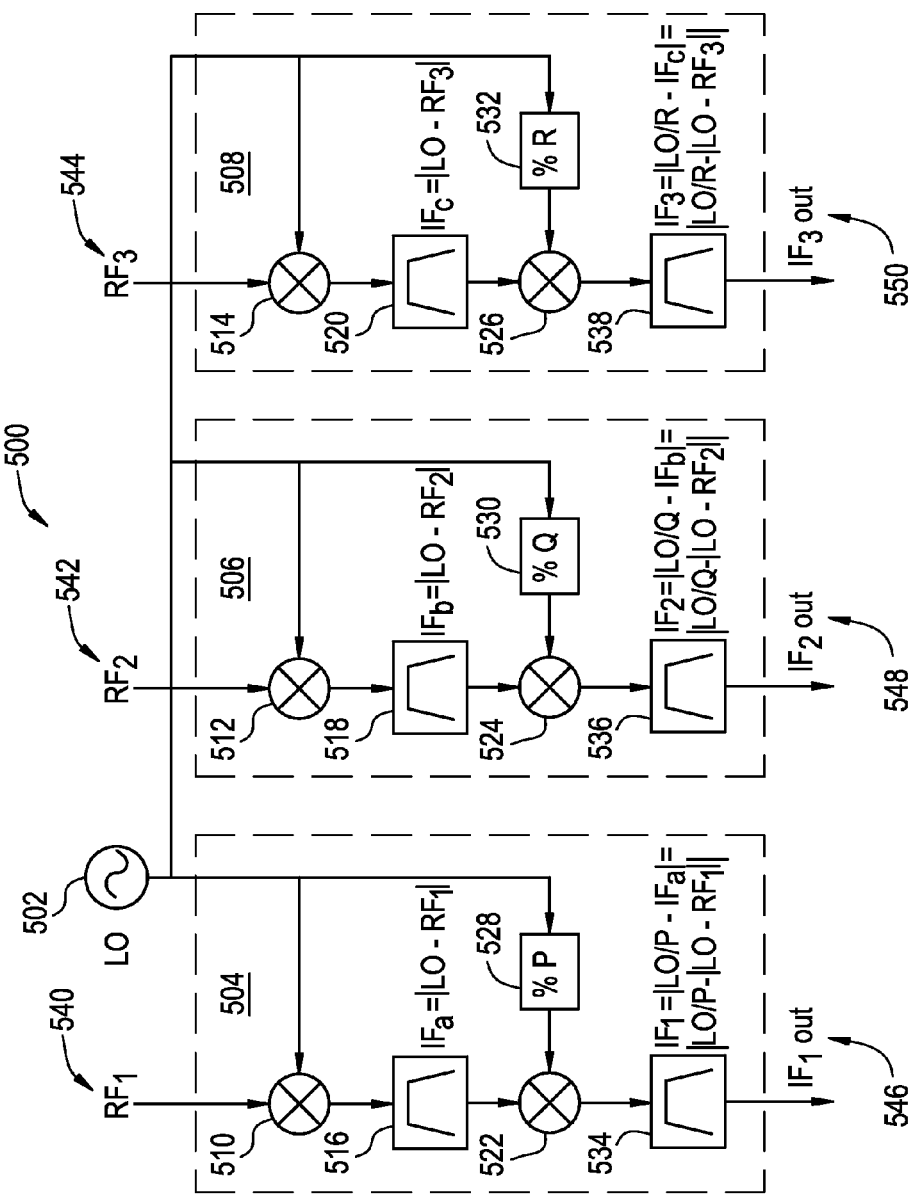
FIG. 5 is a diagram illustrating an example of a receiver having a plurality of down converter chains using a single oscillator.

FIG. 5 is a diagram illustrating an example of a receiver 500, having a plurality of down converter chains using a single oscillator. The illustrated embodiment comprises three down conversion chains 504, 506, 508, sharing a local oscillator 502. In the first chain 504, signals in a first radio frequency band $RF_1$ 540 may be down converted to a first output intermediate frequency $IF_1$ 546. In the second chain 506, signals in a second radio frequency band $RF_2$ 542 may be down converted to a second output intermediate frequency $IF_2$ 548. In the third chain 508, signals in a third radio frequency band $RF_3$ 544 may be down converted to a third output intermediate frequency $IF_3$ 550. As an example, the first, second, and third radio frequency bands 540, 542, and 544 may be in the Ku, Ka-Lo and Ka-Hi bands, respectively.

In each conversion chain 504, 506, and 508, the signals may be first mixed with the LO frequency from the local oscillator 502 and filtered to produce an internal intermediate frequency signal. In the conversion chain 502, the signals on $RF_1$ 540 may be mixed with the output of the LO 502 using the mixer 510, and then filtered through the filter 516 to produce signals on an internal intermediate frequency band $IF_a$. In the conversion chain 506, the signals on $RF_2$ 542 may be mixed with the output of the LO 502 using the mixer 512 and filtered through the filter 518 to produce signals on an internal intermediate frequency band $IF_b$. In the conversion chain 508, the signals on $RF_3$ 544 may be mixed with the output of the LO 502 using the mixer 514 and filtered through the filter 520 to produce signals on an internal intermediate frequency band $IF_c$. Because the frequencies are real, i.e. they have real, positive values (or zero), each of the internal intermediate frequency bands $IF_a$, $IF_b$, $IF_c$, may are also be real, positive numbers (or zero). Accordingly, after mixing and filtering, the internal intermediate frequency bands $IF_a$, $IF_b$, and $IF_c$ may output as follows.

$$IF_a = |LO - RF_1|$$

$$IF_b = |LO - RF_2|$$

$$IF_c = |LO - RF_3|. \qquad \text{Equations 1}$$

Each of the internal intermediate frequencies may then be mixed with a fraction of the output of the LO 502 and again to produce the output intermediate frequencies. For instance, $IF_a$ may be mixed 522 with a fraction 1/P of the output of the LO 502 (generated by a frequency divider 528) using the mixer 522 and then filtered through the filter 534 to produce the first output intermediate frequency $IF_1$ 546. Likewise, $IF_b$ may be mixed with a fraction 1/Q of the output of the LO 502 (generated by a frequency divider 530) using the mixer 524 and filtered through the filter 536 to produce the second output intermediate frequency $IF_2$ 548. Similarly, $IF_c$ is mixed with a fraction 1/R of the output of the LO 502 (generated by a frequency divider 532) using the mixer 526 and filtered through the filter 538 to produce the third output intermediate frequency $IF_3$ 550.

Accordingly, after mixing and filtering, the first, second, and third output intermediate frequency bands $IF_1$, $IF_2$, and $IF_3$ may output as follows.

$$IF_1 = |LO/P - IF_a|$$

$$IF_2 = |LO/Q - IF_b|$$

$$If_3 = |LO/R - IF_c|. \qquad \text{Equations 2}$$

By substituting the internal intermediate frequency bands $IF_a$, $IF_b$, and $IF_c$ of Equations 2 with the internal intermediate frequency bands $IF_a$, $IF_b$, and $IF_c$ of Equations 1 (described above), Equations 2 may yield as follows.

$$IF_1 = |LO/P - IF_a| = |LO/P - |LO - RF_1||$$

$$IF_2 = |LO/Q - IF_b| = |LO/Q - |LO - RF_2||$$

$$IF_3 = |LO/R - IF_c| = |LO/R - |LO - RF_3||. \qquad \text{Equations 3}$$

In many systems, it may be desirable for the output intermediate frequencies (e.g., $IF_1$, $IF_2$, and $IF_3$) to be substantially the same to permit component design sharing in the remainder of the receiver chain (e.g., where $IF_1$ is 250 to 750 MHz and $IF_2$ is 260 to 760 MHz).

Take for example where the output intermediate frequencies listed above (i.e., $IF_1$, $IF_2$, and $IF_3$) fall within the capture range of an analog-to-digital converters (ADC) and where ADCs having a similar design (and using similar band-pass filters) are utilized in the generation of said output intermediate frequencies. In such an example, the substantially same output intermediate frequencies may fall within a frequency range such that the ADCs convert the analog signals to digital signals while meeting certain performance requirements. For instance, the output intermediate frequencies (e.g., $IF_1$, $IF_2$, and $IF_3$) of the examples described above fall within about 500 MHz of each other in the range between 200 and 800 MHz. ADCs having a similar e.g., identical) design may be utilized in generating the output intermediate frequencies listed above while achieving requisite quality (e.g., achieving 50 dB of dynamic range). In such instances the output intermediate frequencies could be considered substantially the same even if they differ from one another by tens of MHz or more.

Consider for example FIG. 6B, which presents output intermediate frequencies that fall in the 200-800 MHz range and differ from each other by as much as 44 MHz, and which also presents output intermediate frequencies that fall within the range of 425 to 950 MHz range and differ from each other by 25 MHz. For both these exemplary ranges, an ADC design that samples frequencies from 425 MHz to 950 MHz can be utilized.

In the illustrated embodiment, if the output intermediate frequency bands are substantially the same, then IF1≅IF2≅IF3 . . . ≅IF. For this to occur, in some embodiments the following condition, which is derived from Equations 3, is fulfilled.

$$|LO/P-|LO-RF1||\cong|LO/Q-|LO-RF2||\cong|LO/R-|LO-RF3||\cong IF.$$ Equations 4

The (input) radio frequency bands 540, 542, and 544 may be characteristics of the receiver environment, and therefore may not be selectable. For some embodiments, the common intermediate frequency IF may be preselected based on other constraints so that, for example, the IF is within the frequency range suitable for ADC sampling.

With respect to FIG. 5, the conditions on the illustrated embodiment provide a set of three independent equations, with four unknown variables, LO, P, Q, and R and four known values $RF_1$, $RF_2$, $RF_3$, and IF. As there are three independent equations, with four unknowns, the system as shown in FIG. 5 may have multiple solutions. For some embodiments, the interim intermediate frequency band $IF_s$ (e.g., $IF_a$, $IF_b$, and $IF_c$) can be chosen to fall in the frequency range suitable for printed filter implementation on a PCB. Afterwards, for a given output intermediate frequency band IF, different LO frequency solutions may be calculated using the formulas described herein, and the choices of P, Q, and R. This analysis may be extended in further embodiments to additional receiver chains when the known system parameters allow solutions of the extended system of equations.

An example of a LO frequency and a division ratio derivation follows. Referring now to FIG. 5, the radio frequency band $RF_1$ 534 may represent the Ku band (e.g., having a center frequency of 12.45 GHz); the radio frequency $RF_2$ 542 may represent the Ka-Lo band (e.g., with center frequency 18.55 GHz), and the radio frequency $RF_3$ 544 may represent the Ka-Hi band (e.g., with center frequency 19.95 GHz). According to this example, the desired output IF frequency bands for the output intermediate frequency bands $IF_1$ 546, $IF_2$ 548, and $IF_3$ 550 may have an intermediate frequency IF of 508 MHz, or 0.5 GHz (center).

In this design process, the output of the LO 502 may be selected to fall between the Ka band and the Ku band (the output frequency of the LO>RF1, and the output frequency of the LO<$RF_2$, $RF_3$). The high side frequency for the internal intermediate frequency band $IF_a$ may be selected such that LO/P<$IF_a$, low side for the internal intermediate frequency band $IF_b$ may be selected such that LO/Q>$IF_b$, and the high side for the internal intermediate frequency band $IF_c$ may be selected such that LO/R<$IF_c$. Under these conditions, the absolute value expressions provided by Equations 4 can be replaced with the corresponding signs of the variables.

$$LO/P+LO-RF_1\cong LO/Q+LO-RF_2\cong LO/R-LO+RF_3\cong IF=0.5\text{ GHz}.$$ Equations 5

The above set of equations may be solved by using three pairs from the above equations and solving for P, Q, R and LO, given the $RF_1$, $RF_2$, $RF_3$, and IF. For example, one solution to the above set of equations for the output intermediate frequency band IF≅508 MHz (center frequency) may be: P=4; Q=10; R=8; and LO=17.30337 GHz. The resulting frequencies for this example are tabulated in Table 1 (FIG. 6A).

In another example, where the output intermediate frequency band IF≅700 MHz (center frequency), the solution to the above set of equations for may be: P=4; Q=10; R=10; and LO=17.5 GHz, The resulting frequencies for this example are shown in Table 2 (FIG. 6B).

Figure 7:
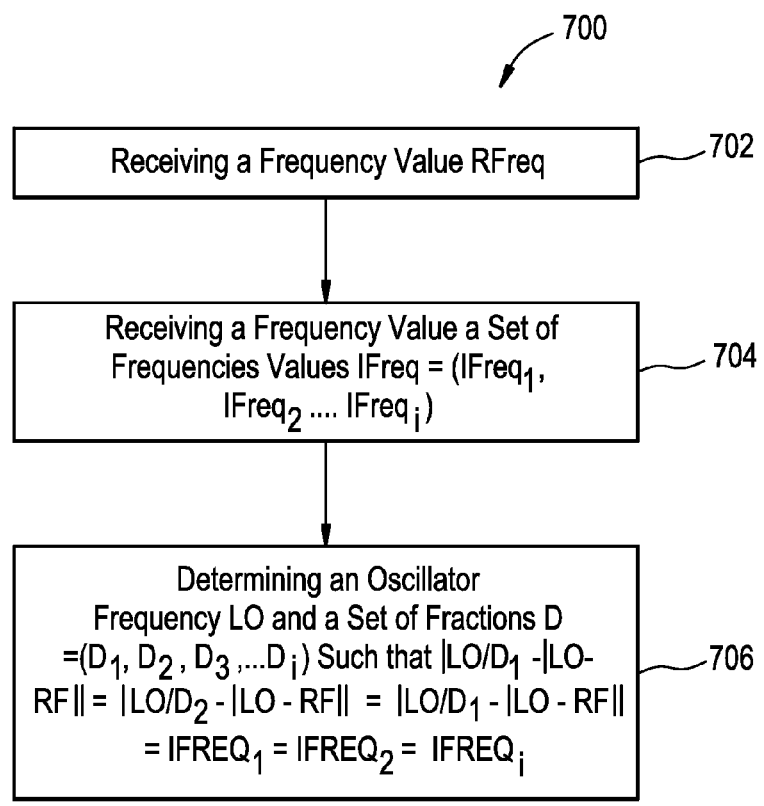
FIG. 7 is a flowchart illustrating an example of a method for designing an apparatus for converting radio frequency (RF) signals in a plurality of frequency bands to intermediate frequency (IF) signals.

FIG. 7 is a flowchart 700 illustrating an example of a method for designing an apparatus for converting radio frequency (RF) signals in a plurality of frequency bands to intermediate frequency (IF) signals in accordance with some embodiments. In the embodiment illustrated in FIG. 7, at operation 702, receiving a frequency value RFreq corresponding to an input RF signal RF for the apparatus. For example, the radio frequency band value RFreq of 12.45 GHz, representing the Ku band, may be received for an input RF signal for the apparatus.

The method may continue with operation 704, by receiving a set of frequencies values IFreq={$IFreq_1$, $IFreq_2$, ... $IFreq_i$}. Each frequency value $IFreq_i$ may respectively correspond to an output IF signal $IF_i$ in a set of output IF signals IF={$IF_1$, $IF_2$, ... $IF_i$} for the apparatus. Additionally, the frequency values in the set of frequency values IFreq may be within substantially the same frequency band. For instance, the set of frequencies values IFreq={$IFreq_1$, $IFreq_2$, ... $IFreq_i$} may have an intermediate frequency IF of 508 MHz.

The method may continue with operation 706, by determining an oscillator frequency LO and a set of fractions D={$D_1$, $D_2$, $D_3$, ... $D_i$}, such that $|LO/D_1-|LO-RF||\cong LO/D_2-|LO-RF||\cong|LO/D_i-|LO-RF||\cong IFreg_1\cong IFreg_2\cong IFreq_i$. Each fraction value $D_i$ may respectively correspond to a frequency divider in a set of frequency dividers Div={$Div_1$, $Div_2$, ... $Div_i$} included in the apparatus. For the operation 706, the apparatus may comprise: an oscillator that generates the oscillator frequency LO; a first-stage mixer configured to down convert the input RF signal RF using the oscillator frequency LO to generate a first-stage IF signal $IF_a$; the set of frequency dividers Div, wherein the frequency divider $Div_i$ is configured to generate a divided oscillation frequency $DLO_i$ in a set of divided oscillation frequencies DLO={$DLO_1$, $DLO_2$, $DLO_3$, ... $DLO_i$} by dividing the oscillator frequency LO by the fraction $D_i$; and a set of second-stage mixer Mix={$Mix_1$, $Mix_2$, ... $Mix_i$}. The second-stage mixer $Mix_i$ may be configured to down convert the first-stage IF signal $IF_a$ using the divided oscillation frequency $DLO_i$ in the set of divided oscillation frequencies DLO to generate the output IF signal $IF_i$.

For example, where the radio frequency band value RFreq of 12.45 GHz, is received at operation 702, and the set of frequencies values IFreq={$IFreq_1$, $IFreq_2$, ... $IFreq_i$} equal to 508 MHz, the operation 706 may determine that the oscillator frequency LO=17.30337 GHz and that the Div={4, 10, 8}.

While various embodiments have been described above, it should be understood that they have been presented by way of example only, and not of limitation. Various embodiments of the invention(s) are not restricted to the illustrated example architectures or configurations. As will be apparent to one of skill in the art, many features can be implemented using a variety of alternative architectures or configurations. With regard to flow diagrams, operational descriptions and method claims, the order in which the steps are presented are not mandatory unless the context dictates otherwise.

The breadth and scope of the disclosure is not limited by any of the above-described exemplary embodiments. The various features, aspects and functionality described in one or more of the individual embodiments are not limited in their applicability to the particular embodiment with which they are described, but instead can be applied, alone or in various combinations, to one or more of the other embodiments, whether or not such embodiments are described and whether or not such features are presented as being a part of a described embodiment.

Terms and phrases used in this document, and variations thereof, unless otherwise expressly stated, should be construed as open ended as opposed to limiting. As examples of the foregoing: the term "including" should be read as meaning "including, without limitation"; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future. The presence of broadening words and phrases such as "one or more," "at least," "but not limited to" or other like phrases shall not be read to mean that the narrower case is intended or required in instances where such broadening phrases may be absent.

The invention claimed is:

1. An apparatus for conversion of radio frequency (RF) signals in a plurality of frequency bands to intermediate frequency (IF) signals, comprising:
    an oscillator capable of generating an oscillator frequency LO;
    a first down conversion chain configured to down convert signals in a first received radio frequency band $RF_1$, comprising:
        a first first-stage mixer coupled to the oscillator and configured to down convert $RF_1$ using the oscillator frequency LO to generate a first-stage IF signal $IF_a$,
        a first frequency divider coupled to the oscillator and configured to generate a first divided oscillation frequency by dividing the oscillator frequency LO,
        a first second-stage mixer coupled to the first frequency divider and the first first-stage mixer and configured to down convert the first-stage IF signal $IF_a$ using the first divided oscillation frequency to generate a first second-stage IF signal $IF_1$,
        a second frequency divider coupled to the oscillator and configured to generate a second divided oscillation frequency by dividing the oscillator frequency LO, and
        a second second-stage mixer coupled to the second frequency divider and the first first-stage mixer and configured to down convert the first-stage IF signal $IF_a$ using the second divided oscillation frequency to generate a second second-stage IF signal $IF_2$; and
    a second down conversion chain configured to down convert signals in a second received radio frequency band $RF_2$, comprising:
        a second first-stage mixer coupled to the oscillator and configured to down convert $RF_2$ using the oscillator frequency LO to generate a second first-stage IF signal $IF_b$.

2. The apparatus of claim 1, further comprising a first-stage filter coupled between the first first-stage mixer and the first second-stage mixer and configured to filter the first-stage IF signal $IF_a$ received by the first second-stage mixer.

3. The apparatus of claim 1, further comprising a first-stage fitter coupled between the first first-stage mixer and the second second-stage mixer and configured to filter the first-stage IF signal $IF_a$ received by the first second-stage mixer.

4. The apparatus of claim 1, wherein the first second-stage IF signal $IF_1$ and the second second-stage IF signal $IF_2$ are within substantially the same frequency band ($IF_1 \cong IF_2$).

5. The apparatus of claim 4, wherein the first frequency divider is configured to generate the first divided oscillation frequency by dividing the oscillator frequency LO by a fraction P, and the second frequency divider is configured to generate a second divided oscillation frequency by dividing the oscillator frequency LO by a fraction Q, and P, Q, and LO are selected such that $|LO/P-|LO-RF_1|| \cong |LO/Q-|LO-RF_2|| \cong IF_1 \cong IF_2$.

6. The apparatus of claim 1, wherein the first received radio frequency band is received by a first antenna and wherein the second received radio frequency band is received by a second antenna.

7. The apparatus of claim 1, wherein the second down conversion chain further comprises a third frequency divider coupled to the oscillator and configured to generate a third divided oscillation frequency by dividing the oscillator frequency LO.

8. The apparatus of claim 7, wherein the second down conversion chain further comprises a third second-stage mixer coupled to the third frequency divider and the second first-stage mixer and configured to down convert the second first-stage IF signal $IF_b$ using the third divided oscillation frequency to generate a third second-stage IF signal $IF_3$.

* * * * *